United States Patent
Roeck et al.

(10) Patent No.: US 10,701,492 B2
(45) Date of Patent: Jun. 30, 2020

(54) METHOD OF MONITORING STATE OF HEALTH OF A BATTERY OF A HEARING DEVICE, A HEARING DEVICE, A HEARING DEVICE AND AN ARRANGEMENT COMPRISING A HEARING DEVICE

(71) Applicant: Sonova AG, Staefa (CH)

(72) Inventors: Hans-Ueli Roeck, Hombrechtikon (CH); Kathrin Vuille-Dit-Bille, Zürich (CH); Fethi Cherigui, Adliswil (CH); Sahba Aazami, Fournex (CH); Jonas Hoegberg, Staefa (CH)

(73) Assignee: Sonova AG, Staefa (CH)

( * ) Notice: Subject to any disclaimer, the term of this patent is extended or adjusted under 35 U.S.C. 154(b) by 72 days.

(21) Appl. No.: 16/084,261

(22) PCT Filed: Mar. 18, 2016

(86) PCT No.: PCT/EP2016/056033
§ 371 (c)(1),
(2) Date: Sep. 12, 2018

(87) PCT Pub. No.: WO2017/157470
PCT Pub. Date: Sep. 21, 2017

(65) Prior Publication Data
US 2019/0075404 A1    Mar. 7, 2019

(51) Int. Cl.
*H04R 25/00*    (2006.01)
*G01R 31/392*    (2019.01)
(Continued)

(52) U.S. Cl.
CPC ....... *H04R 25/305* (2013.01); *G01R 31/3648* (2013.01); *G01R 31/3835* (2019.01);
(Continued)

(58) Field of Classification Search
CPC ............ H04R 25/305; H04R 25/558; H04R 2225/33; G01R 31/3835; G01R 31/392; G01R 31/3648; G01R 31/371
See application file for complete search history.

(56) References Cited

U.S. PATENT DOCUMENTS

| 7,928,735 | B2 * | 4/2011 | Huang | ............... B60L 58/12 |
| | | | | 324/426 |
| 2005/0046389 | A1 * | 3/2005 | Kim | ............... G01R 31/3648 |
| | | | | 320/132 |

(Continued)

FOREIGN PATENT DOCUMENTS

| EP | 2108972 A2 | 10/2009 |
| EP | 2151694 A2 | 2/2010 |

(Continued)

OTHER PUBLICATIONS

International Search Report and Written Opinion; Application PCT/EP2016/056033; Applicant: Sonova AG; Filing Date: Mar. 18, 2016; dated Dec. 6, 2016; 13 pages.

*Primary Examiner* — Jeff W Natalini

(57) ABSTRACT

A method of monitoring state of health of a rechargeable battery (11) comprised within a hearing device (1) is provided, the rechargeable battery (11) being adapted to provide energy for electronic components (2, 8) of the hearing device (1), the method comprising the steps of: dividing a usage time of the hearing device (1) into time slots, determining a number of full equivalent charges applied to the rechargeable battery (11) in each of the time slots, and determining a performance level of the rechargeable battery (11) in dependence on the number of full equivalent charges per time slot. Furthermore, a hearing device adapted to perform the method and an arrangement with the hearing device are provided.

13 Claims, 2 Drawing Sheets

(51) Int. Cl.
*G01R 31/3835* (2019.01)
*G01R 31/36* (2020.01)
*G01R 31/371* (2019.01)

(52) U.S. Cl.
CPC ......... *G01R 31/392* (2019.01); *H04R 25/558* (2013.01); *G01R 31/371* (2019.01); *H04R 2225/33* (2013.01)

(56) References Cited

U.S. PATENT DOCUMENTS

| | | |
|---|---|---|
| 2005/0156571 A1 | 7/2005 | Inui et al. |
| 2007/0063675 A1 | 3/2007 | Walline et al. |
| 2009/0027056 A1 | 1/2009 | Huang |
| 2012/0049802 A1* | 3/2012 | Barsukov ............. G01R 31/367 320/136 |
| 2012/0130660 A1 | 5/2012 | Neumeyer |
| 2014/0089692 A1* | 3/2014 | Hanafusa ............. G01R 31/367 713/310 |
| 2014/0358194 A1* | 12/2014 | Vansickle ............. A61N 1/378 607/59 |
| 2016/0064962 A1* | 3/2016 | Huang ................ H02J 2207/40 320/114 |

FOREIGN PATENT DOCUMENTS

| | | |
|---|---|---|
| EP | 2672731 A1 | 12/2013 |
| EP | 2908556 A1 | 8/2015 |

* cited by examiner

METHOD OF MONITORING STATE OF HEALTH OF A BATTERY OF A HEARING DEVICE, A HEARING DEVICE, A HEARING DEVICE AND AN ARRANGEMENT COMPRISING A HEARING DEVICE

TECHNICAL FIELD

The present invention is related to a method of monitoring state of health of a battery comprised in a hearing device, to a hearing device as well as to an arrangement comprising the hearing device.

BACKGROUND OF THE INVENTION

Hearing devices comprise electronic components that must be supplied with electric energy during operation. This is achieved by either providing a regular battery or by a rechargeable battery within the housing of the hearing device.

For rechargeable batteries, it is well known that the initially available capacity diminishes after repeated full discharge/charge cycles. Other circumstances may also affect available capacity of a rechargeable battery, as for example when rechargeable batteries are stored over long time at a fully charged state (as when being left in the charger after a charging cycle has been completed), or when rechargeable batteries are discharged below a safe low voltage level or are charged above a maximum charging level. Rechargeable batteries reaching about 80% of its initial or nominal capacity are deemed to be defect and need to get replaced.

The reason for the gradual deterioration of a rechargeable battery is due to irreversible physical and chemical changes which take place with usage and with age.

From time to time, all hearing devices are checked for a flawless operation by a hearing device professional. On this occasion, a defective rechargeable battery—or one that is about to reach its end of life—should also be replaced. While a defective rechargeable battery might be easily identified, a rechargeable battery that is about to reach its end of life is not easily identifiable. Therefore, every rechargeable battery must undergo specific tests in order to obtain assurance with regard to the question whether the rechargeable battery may still remain in the hearing device or whether it must be replaced because a battery failure is likely to occur before the next visit at the hearing device professional's office. Such tests incorporate additional measurements and are therefore time consuming.

WO 2004/084582 A1 describes a rechargeable battery for a hearing device comprising a memory to store charging control parameters for an optimized charging algorithm in order to positively influence total battery life time.

US 2012/0130660 A1 discloses a power consumption monitor in a hearing device that is used to monitor the charge of a battery to predict and indicate to the user when it is time to charge the battery again to allow uninterrupted operation of the hearing device.

Although the known techniques allow to optimally operate a hearing device in terms of energy consumption and energy availability, respectively, the known techniques do not provide any indication as to when a rechargeable battery being used to provide energy to the hearing device must be replaced because the rechargeable battery has reached its end of life.

It is therefore an object of the present invention to provide a method of monitoring state of health of a battery.

SUMMARY OF THE INVENTION

The term "state of health of a battery", as it is used in connection with the present invention throughout this description, must be understood as a measure that reflects the general condition of a battery and its ability to deliver the specified performance compared with a fresh battery. It may take into account such factors as charge acceptance, internal resistance, voltage and self-discharge. It is a measure of the long term capability of the battery and gives an indication not an absolute measure of how much of the available lifetime energy throughput of the battery has been consumed, and how much is left.

First, the present invention is directed to a method of monitoring state of health of a rechargeable battery comprised within a hearing device, the rechargeable battery being adapted to provide energy for electronic components of the hearing device, the method comprising the steps of:
  dividing a usage time of the hearing device into time slots,
  determining a number of full equivalent charges applied to the rechargeable battery (11) in each of the time slots, and
  determining a performance level of the rechargeable battery (11) in dependence on the number of full equivalent charges per time slot.

The service personnel is able to know if the rechargeable battery in the hearing device needs to be replaced without performing any additional measurements.

In an embodiment of the method according to the present invention 1, the step of determining the performance level comprises the steps of:
  comparing the number of full equivalent charges within the time slots with at least one predefined number, each of which represents a certain performance level,
  assigning the performance level pertaining to the highest predefined number which has been surpassed by the number of full equivalent charges.

Further embodiments of the method according to the present invention, further comprise the step of indicating the determined performance level to at least one of:
  the hearing device user;
  a service point of a hearing device provider;
  a hearing care provider.

In further embodiments of the method according to the present invention, the step of determining the number of full equivalent charges in a time slot comprises the steps of:
  estimating a state of battery charge level before charging the battery,
  estimating the state of battery charge level after charging the battery,
  determining a charge difference by subtracting the state of battery charge level before charging the battery from state of battery charge level after charging the battery, and
  accumulating charge differences of all charges in a time slot for obtaining the number of full equivalent charges in the specific time slot.

In still further embodiments of the method according to the present invention, the step of estimating the state of battery charge level comprises the steps of:
  measuring a battery voltage, and
  determining state of battery charge level from a discharge curve at the measured battery voltage.

In still further embodiments of the method according to the present invention, the time slots are predefined time slots particularly having a length of 100 to 1'600 hours, more particularly being equal to 500 hours, of actual usage of the hearing device.

In still further embodiments of the method according to the present invention, the step of determining the number of full equivalent charges is performed within the hearing device.

In still further embodiments of the method according to the present invention, the step of comparing the number of full equivalent charges and the step of determining the performance level are performed in an auxiliary device outside of the hearing device.

Second, the present invention is directed to a hearing device comprising
- a processor,
- further electronic components,
- a rechargeable battery providing energy for the processor and the further electronic components, wherein the processor is adapted to perform the steps of method according to the present invention.

Third, the present invention is directed to an arrangement comprising a hearing device and an auxiliary device,
- the hearing device comprising:
  - a processor,
  - a transceiver,
  - further electronic components,
  - a rechargeable battery providing energy for the processor, the transceiver and the further electronic components,
- the auxiliary device comprising:
  - an auxiliary processor,
  - an auxiliary transceiver, and
  - an auxiliary battery providing energy for the auxiliary processor and the auxiliary transceiver, wherein the transceiver and the auxiliary transceiver are adapted to exchange information, wherein the processor is adapted to determine a number of full equivalent charges in time slots, and wherein the auxiliary processing unit is adapted to determine a performance level of the rechargeable battery in dependence on the number of full equivalent charges within a time slot.

It is pointed out that the above-mentioned embodiments may be combined in any manner to obtain further embodiments.

Only those embodiments or combinations of embodiments are excluded that would result in contradictions.

BRIEF DESCRIPTION OF THE DRAWINGS

Below, the invention is described in more detail by referring to drawings showing exemplified embodiments.

The embodiments are meant as examples and shall not confine the invention.

DETAILED DESCRIPTION OF THE INVENTION

Figure 1:
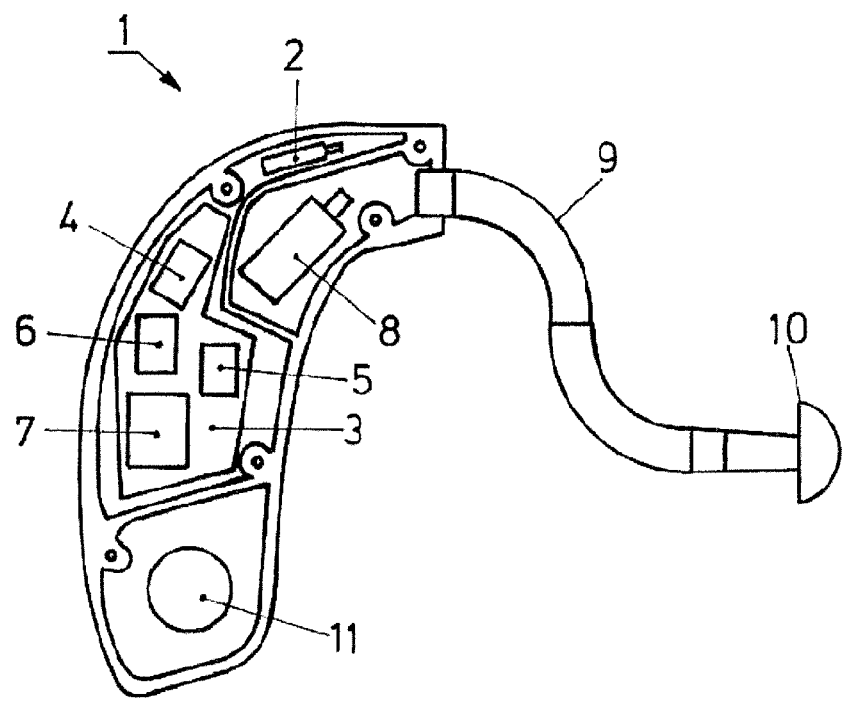
FIG. 1 shows a cross-sectional view of a hearing device configured to monitoring state of health of a battery comprised in the hearing device.

FIG. 1 shows a cross-sectional view of a hearing device 1 configured to monitoring state of health of a battery 2 comprised in the hearing device 1, which includes a microphone 2 to convert sounds into electrical signals. The microphone 2 is connected to circuit 3, which includes at least one processor 4, controller 5, transceiver 6, and memory 7. Further, the hearing device 1 includes a speaker 8, also called receiver in the technical field of hearing devices, connected to the processor 4 via electrical leads (not shown) and configured to communicate audio data through an ear canal tube 9 to an ear piece 10, which may be positioned within the ear canal of a user. Further, the hearing device 1 comprises a rechargeable battery 11 to supply power to the other components.

In an example, the microphone 2 converts sounds into electrical signals and provides the electrical signals to the processor 4, which processes the electrical signals according to a sound shaping algorithm to produce a modulated output signal that is customized to a user's particular hearing ability. The modulated output signal is provided to the speaker 8, which reproduces the modulated output signal as an audio signal and which provides the audio signal to the ear piece 10 through the ear canal tube 9. In an alternative embodiment, the speaker 8 may be included within an ear piece 10 and may be coupled to circuit 3 by a wire extending through ear canal tube 9.

In some instances, the transceiver 6 operates as an input/output terminal. Thereto, the transceiver 6 provides wired or wireless communication to a remote device (not shown in FIG. 1).

FIG. 1 shows a cross-sectional view of the internal components of a behind-the-ear hearing device 1. It should be appreciated that any type of hearing devices may be used, in particular, ITE-(In-The-Ear)-, CIC-(Completely-In-the-Canal)-hearing devices.

In the following, a method according to the present invention is described that is applied in the hearing device of FIG. 1, for example.

When the method according to the present invention is applied, it is assumed that the user of the hearing device does not change his or her average usage pattern over a reasonably long time, for example one month. Thus, the usage time of the hearing device is divided into time slots of one month or 500 hours, for example. For each such time slot, a number of full equivalent charges per usage time is measured.

In order to further illustrate this, an example is given. In the example, it is assumed that the rechargeable battery is charged daily resulting in 30 charges per month. Furthermore, it is assumed that the rechargeable battery is only partially discharged down to 23% remaining charge. For this example, a full equivalent charge of $30\times(100\%-23\%)=23.1$ are applied to the rechargeable battery. I.e. the state of NOMINAL charge of the battery of the hearing device is estimated before and after charging, and the difference over a time slot are than accumulated.

Figure 2:
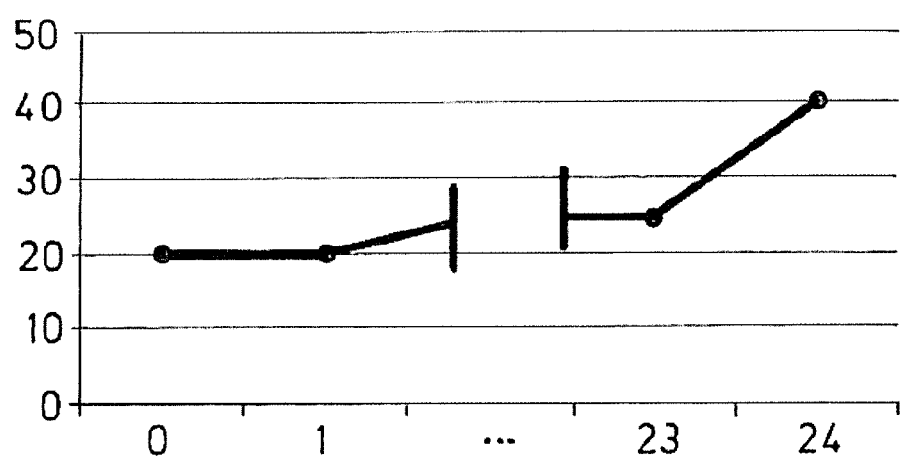
FIG. 2 shows a possible graph, in which full equivalent charges versus time slots are indicated for a rechargeable battery.

Given the constant usage pattern over such a time frame, the number of full equivalent charges will remain constant if the state of health of the rechargeable battery is unchanged. However, the number of full equivalent charges will increase for a bad battery, as the effectively available charge diminishes, while the estimation algorithm assumes a nominal battery capacity. As a result, a bad battery can and will be detected by the method of the present invention if the number of full equivalent charges per time slot increases above a predefined threshold, which is dependent on the battery characteristics. This is illustrated in FIG. 2 showing a graph indicating the time slots on the abscissa and indicating the number of full equivalent charges on the ordinate. As can be seen from the graph depicted by FIG. 2, the number of full equivalent charges remains clearly stable at approximately 25 full equivalent charges until the 23$^{rd}$ time slot indicating a break point as after with the 24$^{th}$ time slot the number of equivalent charges significantly raises, in the example shown in FIG. 2, the full equivalent charges rise to 40. Therefore, the predefined threshold applied to detect a bad battery is set to 35, for example, for this kind of rechargeable battery.

The nominal state of charge of the battery can get derived from measuring the battery voltage and look-up of the battery charge state via a table, which contains the nominal discharge curve.

Figure 3:
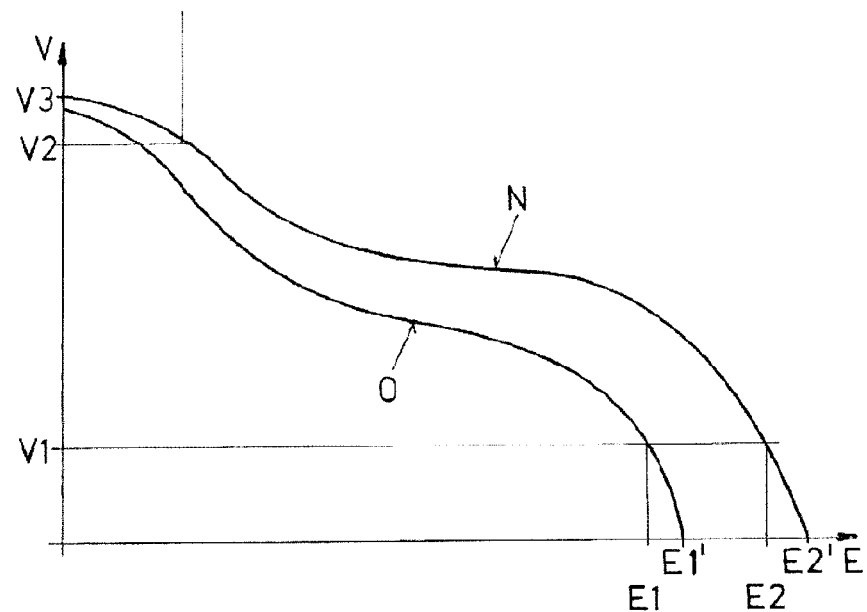
FIG. 3 shows discharge curves of a new and an old rechargeable battery.

FIG. 3 shows examples for discharge curves of a rechargeable battery. A graph N represents a new battery cell and a graph O represents an old battery of the same type, an output voltage V of the battery being indicated on the ordinate and energy E being indicated on the abscissa. A full battery has an output voltage V2 or above and an empty battery having an output voltage of V1 or below. However, the look-up table only comprises values of one graph, i.e. either the values of a corresponding new battery or the values of an old battery.

In a further embodiment of the method according to the present invention, the statistical data is only collect by the hearing device, i.e. the number of full equivalent charges are obtained within the hearing device, while the logic to differentiate between good and bad batteries does not reside in the hearing device but in an external device (not shown in the figures). When an external device is reading out the result, i.e. the number of full equivalent charges per time slot, it can be presented in the same manner as it has been described in connection with the embodiment of FIG. 1, for example.

In a further embodiment of the method according to the present invention, the hearing device will also comprise the decision logic for deciding if the number of equivalent charges is below a first threshold (indicating a good performance level of the battery), above at least a first threshold (e.g. a warning level indicating a mediocre performance level) or even above a second threshold (e.g. a "dead battery" level indicating a critical performance level). The evaluation result might then be presented to the user of the hearing device, to an audiologist or to a service personnel in an appropriate manner, such as an acoustical notification, a visual indication in a user control application (app), a fitting software or some other appropriate way.

Figure 4:
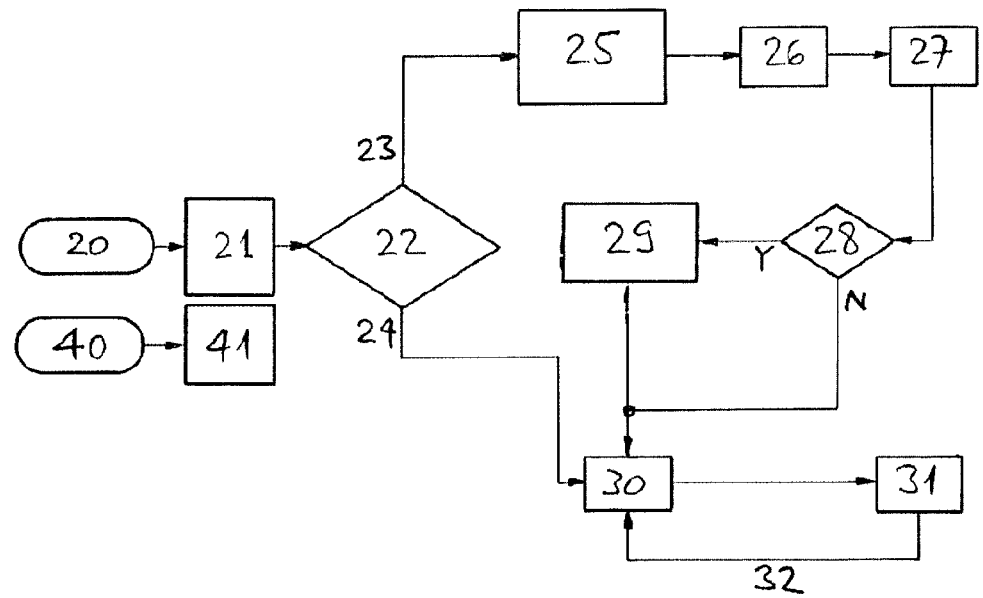
FIG. 4 shows a flow chart of an embodiment of the method according to the present invention.

FIG. 4 shows a flow chart of an embodiment of the method according to the present invention. While the flow chart is self-explanatory, it is pointed out that the monthly hour counter measures usage time in months, i.e. the monthly hour counter does not indicate the usage time in an actual month.

Reference sign used in FIG. 4:
20 Boot
21 Wait for battery voltage recovery to drop
22 Current Vbat greater than stored Vbat?
23 Yes (The battery was charged)
24 No (Battery was not charged)
25 With current Vbat, stored Vbat and battery characteristic calculate charged capacity
26 Store in monthly charge slot
27 Get monthly hour counter
28 New month?
29 Reset monthly counter and next charge use a new monthly charge slot
30 Store Vbat
31 Start 1 hour timer
32 Timer expired
40 End of life detected
41 Stop timer for continuous logging and store Vbat

The invention claimed is:

1. A method of monitoring a rechargeable battery, the method comprising:
dividing a usage time of a hearing device into time slots;
determining a number of full charges applied to the rechargeable battery in each of the time slots;
comparing the number of full charges within the time slots with at least one predefined number, each of which represents a performance level,
assigning the performance level pertaining to a highest predefined number that has been surpassed by the number of full charges,
wherein determining the number of full charges in the time slot further comprises:
estimating a state of battery charge level before charging the battery;
estimating the state of battery charge level after charging the battery;
determining a charge difference by subtracting the state of battery charge level before charging the battery from state of battery charge level after charging the battery;
accumulating charge differences of all charges in a time slot for obtaining the number of full equivalent charges in the specific time slot; and
providing the performance level to another device or storing the performance level in the hearing device.

2. The method of claim 1, further comprising:
providing the determined performance level to a hearing device user; or
providing the determined performance level to a hearing device provider.

3. The method of claim 1, wherein estimating the state of battery charge level further comprises:
measuring a battery voltage, and
determining state of battery charge level from a discharge curve at the measured battery voltage.

4. The method of claim 3, wherein the time slots are predefined time slots having a length of 100 to 1600 hours.

5. The method of claim 4, wherein determining the number of full charges is performed within the hearing device.

6. The method of claim 5, wherein comparing the number of full charges and determining the performance level are performed in an auxiliary device outside of the hearing device.

7. A hearing device comprising:
a processor;
a rechargeable battery providing energy for the processor;
a memory coupled to the processor,
wherein the processor is adapted to perform operations stored in the memory, the operations comprising:
dividing a usage time of a hearing device into time slots;
determining a number of full charges applied to the rechargeable battery in each of the time slots;
determining a performance level of the rechargeable battery based on the number of full charges per time slot, wherein determining the performance level further comprises:
comparing the number of full charges within the time slots with at least one predefined number, each of which represents a performance level,
assigning the performance level pertaining to a highest predefined number that has been surpassed by the number of full charges,
wherein determining the number of full charges in a time slot further comprises:
estimating a state of battery charge level before charging the battery;
estimating the state of battery charge level after charging the battery;
determining a charge difference by subtracting the state of battery charge level before charging the battery from state of battery charge level after charging the battery; and
accumulating charge differences of all charges in a time slot for obtaining the number of full equivalent charges in the specific time slot.

8. The hearing device of claim 7, wherein the hearing device is a hearing aid.

9. The hearing device of claim 7, wherein the hearing device is an In-The-Ear (ITE) or a Completely-In-the-Canal hearing aid.

10. A system comprising, the system comprising:
a hearing device, wherein the hearing device comprises:
a processor,
a transceiver,
a rechargeable battery configured to provide energy for the processor,
an auxiliary device comprising:
an auxiliary processor,
an auxiliary transceiver, and
an auxiliary battery providing energy for the auxiliary processor and the auxiliary transceiver,
wherein the transceiver and the auxiliary transceiver are configured to exchange information,
wherein the processor is adapted to determine a number of full charges in time slots, and
wherein the auxiliary processing unit is configured to determine a performance level of the rechargeable battery based on the number of full charges within a time slot by;
comparing the number of full charges within the time slots with at least one predefined number, each of which represents a performance level,
assigning the performance level pertaining to a highest predefined number that has been surpassed by the number of full charges,
wherein determining the number of full charges in a time slot further comprises:
estimating a state of battery charge level before charging the battery;
estimating the state of battery charge level after charging the battery;
determining a charge difference by subtracting the state of battery charge level before charging the battery from state of battery charge level after charging the battery;
accumulating charge differences of all charges in a time slot for obtaining the number of full equivalent charges in the specific time slot; and
providing the performance level to another device or storing the performance level in the hearing device.

11. The hearing device of claim 10, wherein the hearing device is a hearing aid.

12. The hearing device of claim 10, wherein the hearing device is an In-The-Ear (ITE) or a Completely-In-the-Canal hearing aid.

13. A non-transitory computer-readable medium storing instructions that when executed by a processor cause a device to perform the following operations:
dividing a usage time of a hearing device into time slots;
determining a number of full charges applied to a rechargeable battery of the hearing device in each of the time slots;
comparing the number of full charges within the time slots with a predefined performance level;
assigning the performance level pertaining to a highest predefined number that has been surpassed by the number of full charges;
determining the number of full charges in a time slot by:
estimating a state of battery charge level before charging the rechargeable battery;
estimating the state of battery charge level after charging the rechargeable battery;
determining a charge difference by subtracting the state of battery charge level before charging the battery from state of battery charge level after charging the battery;
accumulating charge differences of all charges in a time slot for obtaining the number of full equivalent charges in the specific time slot; and
providing the performance level to another device or storing the performance in the hearing device.

* * * * *